(12) United States Patent
Thuringer et al.

(10) Patent No.: US 7,639,015 B2
(45) Date of Patent: Dec. 29, 2009

(54) METHODS AND SYSTEMS FOR STABILIZING AN AMPLIFIER

(75) Inventors: Daniel Joseph Thuringer, Colorado Springs, CO (US); Jake Otis Deem, Colorado Springs, CO (US); James Richard Carpenter, Colorado Springs, CO (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 11/770,493

(22) Filed: Jun. 28, 2007

(65) Prior Publication Data

US 2008/0048776 A1    Feb. 28, 2008

Related U.S. Application Data

(63) Continuation-in-part of application No. 11/443,884, filed on May 31, 2006, now Pat. No. 7,248,113, which is a continuation of application No. 10/623,414, filed on Jul. 18, 2003, now Pat. No. 7,075,366.

(51) Int. Cl.
*G01V 3/00* (2006.01)
(52) U.S. Cl. ..................... 324/322; 324/318
(58) Field of Classification Search ............... 324/322, 324/318
See application file for complete search history.

(56) References Cited

U.S. PATENT DOCUMENTS

| 4,739,268 A | 4/1988 | Fox ............................ 324/314 |
| 5,066,923 A | 11/1991 | Gailus et al. ................. 330/107 |
| 5,227,728 A | 7/1993 | Kaufman et al. ............. 324/322 |
| 5,270,657 A | 12/1993 | Wirth et al. .................. 324/322 |
| 5,442,290 A | 8/1995 | Crooks ........................ 324/309 |
| 5,489,875 A | 2/1996 | Cavers ......................... 330/151 |
| 5,537,080 A | 7/1996 | Chawla et al. ............... 330/266 |
| 5,675,288 A | 10/1997 | Peyrotte et al. ............. 330/149 |
| 6,087,901 A | 7/2000 | Nakanishi et al. ........... 330/305 |
| 6,172,560 B1 | 1/2001 | Yamashita et al. ............ 330/52 |
| 6,313,703 B1 | 11/2001 | Wright et al. ................ 330/149 |
| 6,459,265 B1 * | 10/2002 | Lou et al. .................... 324/322 |
| 6,606,483 B1 | 8/2003 | Baker et al. ................. 455/126 |
| 6,680,649 B2 | 1/2004 | Rydin ......................... 330/149 |
| 6,734,732 B2 | 5/2004 | Cavers ........................ 330/149 |
| 6,819,938 B2 | 11/2004 | Sahota ........................ 370/318 |
| 7,075,366 B2 | 7/2006 | Deem et al. ................. 330/151 |
| 7,248,113 B2 | 7/2007 | Deem et al. ................. 330/151 |

(Continued)

FOREIGN PATENT DOCUMENTS

EP    0 562 791    3/1993

(Continued)

OTHER PUBLICATIONS

International Search Report for PCT/US2004/024348.

*Primary Examiner*—Louis M Arana
(74) *Attorney, Agent, or Firm*—Proskauer Rose LLP

(57) ABSTRACT

The invention generally relates to stabilizing an MRI power delivery system. In one aspect, a stabilization module that is in electrical communication with the MRI power delivery system is provided. The stabilization module includes a closed loop control system. The closed loop control system is used to modify the at least one characteristic of the input signal. The modified input signal is provided to the MRI power delivery system.

25 Claims, 10 Drawing Sheets

U.S. PATENT DOCUMENTS 7,253,625 B2 * 8/2007 Trabbic et al. ............... 324/322
7,358,737 B2 * 4/2008 Hoult .......................... 324/322

FOREIGN PATENT DOCUMENTS

| EP | 0 665 641 | 12/1994 |
| EP | 1 309 094 | 7/2003 |
| GB | 2 157 108 | 3/1985 |
| WO | WO 2005/083458 | 9/2005 |
| WO | WO 2005/124382 | 12/2005 |
| WO | WO 2006/022650 | 3/2006 |

* cited by examiner

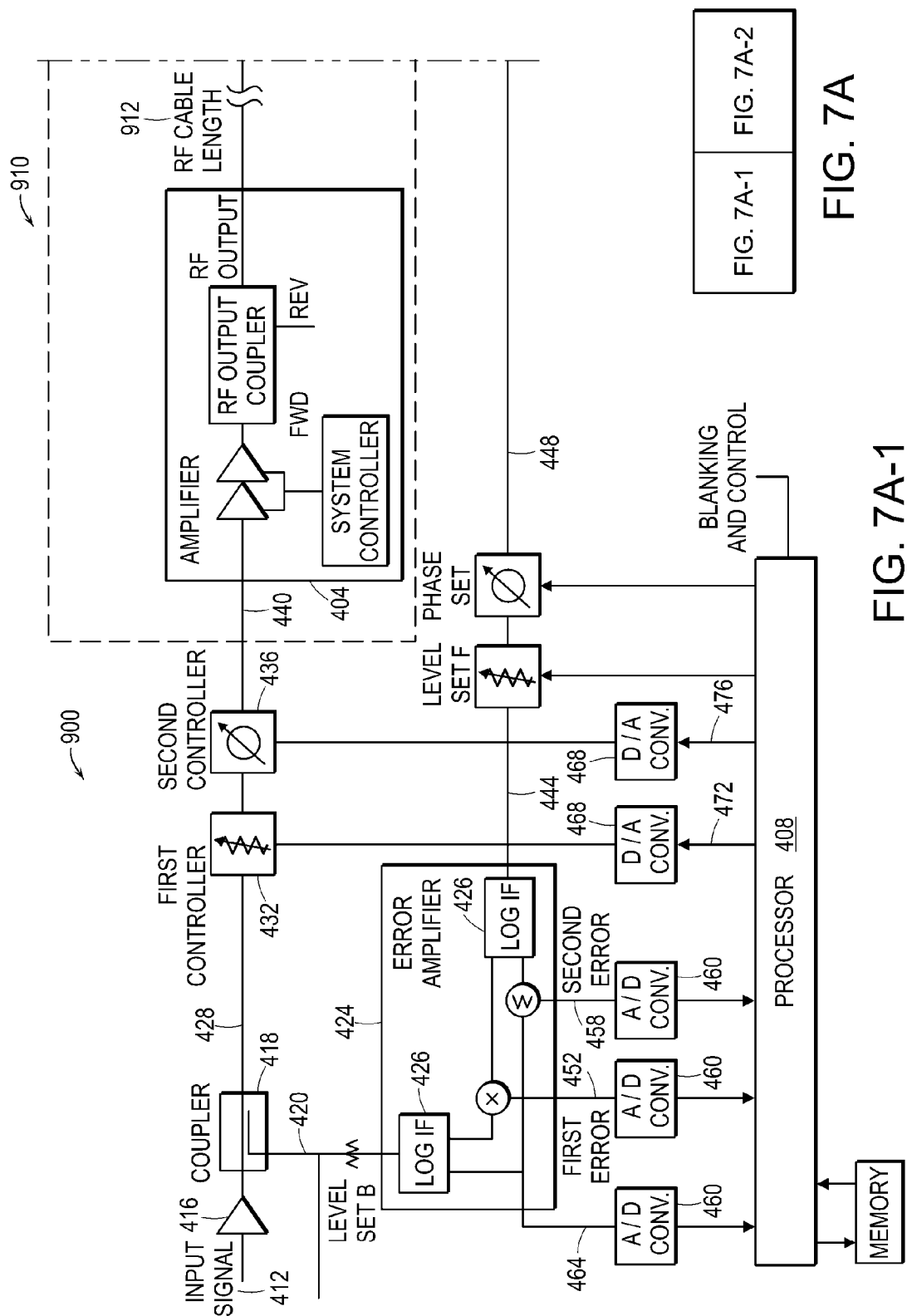

METHODS AND SYSTEMS FOR STABILIZING AN AMPLIFIER

RELATED APPLICATIONS

This application is a continuation-in-part of U.S. application Ser. No. 11/443,884, filed May 31, 2006, which is a continuation of U.S. Pat. No. 7,075,366, issued Jul. 11, 2006, the entire teachings of which are incorporated herein by reference.

TECHNICAL FIELD

The invention generally relates to methods and systems for stabilizing an amplifier. More particularly, the invention relates to methods and systems that use a combination of open loop and closed loop control systems for stabilizing the amplifier.

BACKGROUND INFORMATION

Typically, a magnetic resonance imaging (MRI) system employs a radio frequency (RF) amplifier to drive RF coils located within a main magnet structure of the MRI system. The RF amplifier accepts as input a series of pulses generated by an external RF source and generates as output a series of pulses of increased power. The RF amplifier's output is used to drive the RF coils.

As improved image quality is demanded, higher Tesla magnets are required, necessitating greater RF amplifier output power. Providing a greater output power, however, can introduce RF amplifier gain non-linearities and phase non-linearities into the system and, consequently, can result in distortions in the MRI image.

SUMMARY OF THE INVENTION

The present invention provides methods and systems for stabilizing an amplifier. Typically, the methods and systems stabilize a pulsed RF amplifier used in an MRI system. However, the methods and systems of the present invention may also be used to stabilize amplifiers used in other systems. For example, they may be used to stabilize a pulsed RF radar amplifier.

In one embodiment of the present invention, a stabilization module of the present invention combines hardware and software for stabilizing the amplifier. The stabilization module includes both an open loop control system and a closed loop control system.

Using a closed loop control system at the start of a pulse tends to result in instability (e.g., the gain and phase parameters of the closed loop control system tend to be driven to their maximum or minimum values). Thus, embodiments of the present invention use the open loop control system at the start of a pulse to stabilize the amplifier. The open loop control system stabilizes the amplifier by, for example, using the input power of an input signal received by the stabilization module. Once the amplifier has settled, the closed loop control system is used to further stabilize the amplifier.

In some embodiments, the systems and methods of the invention use a calibration routine for improving the performance of the open loop control system. The calibration routine, in some embodiments, generates outputs for use by the open loop control system based on outputs previously generated by the closed loop control system. The calibration routine thereby enables the open loop control system to learn from the closed loop control system. Consequently, the open loop control system's performance is improved over time.

In one aspect, the invention generally involves a method for stabilizing an amplifier. The method includes four steps. One step is providing a stabilization module that is in electrical communication with the amplifier and that includes an open loop control system and a closed loop control system. Another step is using the open loop control system to modify at least one characteristic of an input signal received by the stabilization module and to pass control to the closed loop control system. Another step is using the closed loop control system to modify the at least one characteristic of the input signal. The final step is providing the modified input signal to the amplifier.

In various embodiments of this aspect of the invention, the at least one characteristic of the input signal is an amplitude of the input signal or a phase of the input signal. In one embodiment, the open loop control system is used when an input power of the input signal is above a threshold level. In another embodiment, the closed loop control system is used after using the open loop control system for a pre-determined period of time during which an input power of the input signal is above a threshold level. Filters in the closed loop control system of one embodiment are initialized by the open loop control system based on outputs of the open loop control system.

In some embodiments, an input power of the input signal is measured. In some such embodiments, the open loop control system is used to modify the at least one characteristic of the input signal based on the input power. In one such embodiment, the open loop control system modifies the at least one characteristic of the input signal based on a value in a look-up table corresponding to the input power. The look-up table may be updated based on outputs of the closed loop control system. In some such embodiments, a first error between the input signal and a feedback signal representative of an output signal of the amplifier and a second error between the input signal and the feedback signal are also measured. The closed loop control system in one such embodiment is used to modify the at least one characteristic of the input signal based on the input power, the first error, and the second error. In another such embodiment, the closed loop control system adjusts both the first error and the second error.

In some embodiments, the closed loop control system accounts for at least one non-linearity introduced by the stabilization module. In other embodiments, the open loop control system accounts for at least one non-linearity introduced by the stabilization module. The amplifier is, in some embodiments, a pulsed radio frequency amplifier of a magnetic resonance imaging system.

In another aspect, the invention generally involves a system for use in a stabilization module for stabilizing an amplifier. The system includes a first control module and a second control module. The first control module is for performing three functions: (a) receiving a first signal representative of an input signal received by the stabilization module, (b) generating a second signal capable of being used to modify a first characteristic of the input signal using an open loop control routine, and (c) sending a third signal capable of being used to pass control to a second control module. The second control module is for generating a fourth signal capable of being used to modify the first characteristic of the input signal using a closed loop control routine.

In some embodiments of this aspect of the invention, the first control module is capable of determining if an input power of the input signal is above a threshold level and of generating the second signal capable of being used to modify the first characteristic of the input signal using the open loop control routine when the input power is above the threshold level. In some embodiments, the first control module is capable of determining if the first control module has been using the open loop control routine for a pre-determined period of time during which an input power of the input signal was above a threshold level. In some such embodiments, the first control module sends the third signal when the foregoing criterion has been met. In an embodiment in which the second control module includes filters, the system may further include a calibration module for generating entries for initializing the filters. The first control module, in one such embodiment, is capable of using the entries to initialize the filters in the second control module.

In some embodiments, the first control module is capable of generating a fifth signal capable of being used to modify a second characteristic of the input signal using the open loop control routine and the second control module is capable of generating a sixth signal capable of being used to modify the second characteristic of the input signal using the closed loop control routine. In some related embodiments, the system includes a calibration module for generating a first value representing an amount to modify the first characteristic of the input signal and a second value representing an amount to modify the second characteristic of the input signal. The first value and the second value may be used by the first control module. In one embodiment, the first control module is capable of using the first value to generate the second signal and of using the second value to generate the fifth signal. In a related embodiment, the calibration module is capable of updating the first value and the second value based on outputs of the second control module. In yet another embodiment, the calibration module is capable of generating the first value and the second value to account for at least one non-linearity introduced by the stabilization module.

In some embodiments, the first characteristic of the input signal is an amplitude of the input signal and the second characteristic of the input signal is a phase of the input signal. In still further embodiments, the second control module is capable of generating the fourth signal to account for a non-linearity introduced by the stabilization module and the second control module is capable of receiving a first error signal and a second error signal and of adjusting the first error signal and the second error signal to compensate for a non-linearity present in the first error signal and the second error signal. In still other embodiments, the first control module accounts for a non-linearity introduced by the stabilization module in generating the second signal.

In yet another aspect, the invention generally features an article of manufacture for use with a stabilization module for stabilizing an amplifier. The article includes means for receiving a first signal representative of an input signal received by the stabilization module, for generating a second signal capable of being used to modify a characteristic of the input signal using an open loop control routine, and for sending a third signal capable of being used to pass control to a second control module. The article also includes means for generating a fourth signal capable of being used to modify the characteristic of the input signal using a closed loop control routine.

In still another aspect, the invention relates to a method for stabilizing an amplifier. The method includes three steps. One step is receiving an input signal with a stabilization module that includes an open loop control system and a closed loop control system. Another step is using the open loop control system to modify a phase of the input signal and minimize a phase non-linearity of the amplifier and to pass control to the closed loop control system. The other step is transitioning from using the open loop control system to using the closed loop control system to modify the phase of the input signal and minimize the phase non-linearity of the amplifier.

In one embodiment of this aspect of the invention, the method includes transitioning after using the open loop control system for a pre-determined period of time during which an input power of the input signal is above a threshold level. In another embodiment, the method further includes using the open loop control system to initialize a filter in the closed loop control system based on an output of the open loop control system.

In a further aspect, the invention generally involves a stabilization module for stabilizing an amplifier. The stabilization module includes a first control module and a second control module. The first control module is for performing three functions: (a) receiving a first signal representative of an input signal received by the stabilization module, (b) generating a second signal capable of being used to minimize a phase non-linearity of the amplifier by modifying a phase of the input signal using an open loop control routine, and (c) sending a third signal capable of being used to pass control to a second control module. The second control module is for generating a fourth signal capable of being used to minimize a phase non-linearity of the amplifier by modifying the phase of the input signal using a closed loop control routine.

BRIEF DESCRIPTION OF THE DRAWINGS

The foregoing and other objects, aspects, features, and advantages of the invention will become more apparent and may be better understood by referring to the following description taken in conjunction with the accompanying drawings, in which.

DETAILED DESCRIPTION

Figure 1:
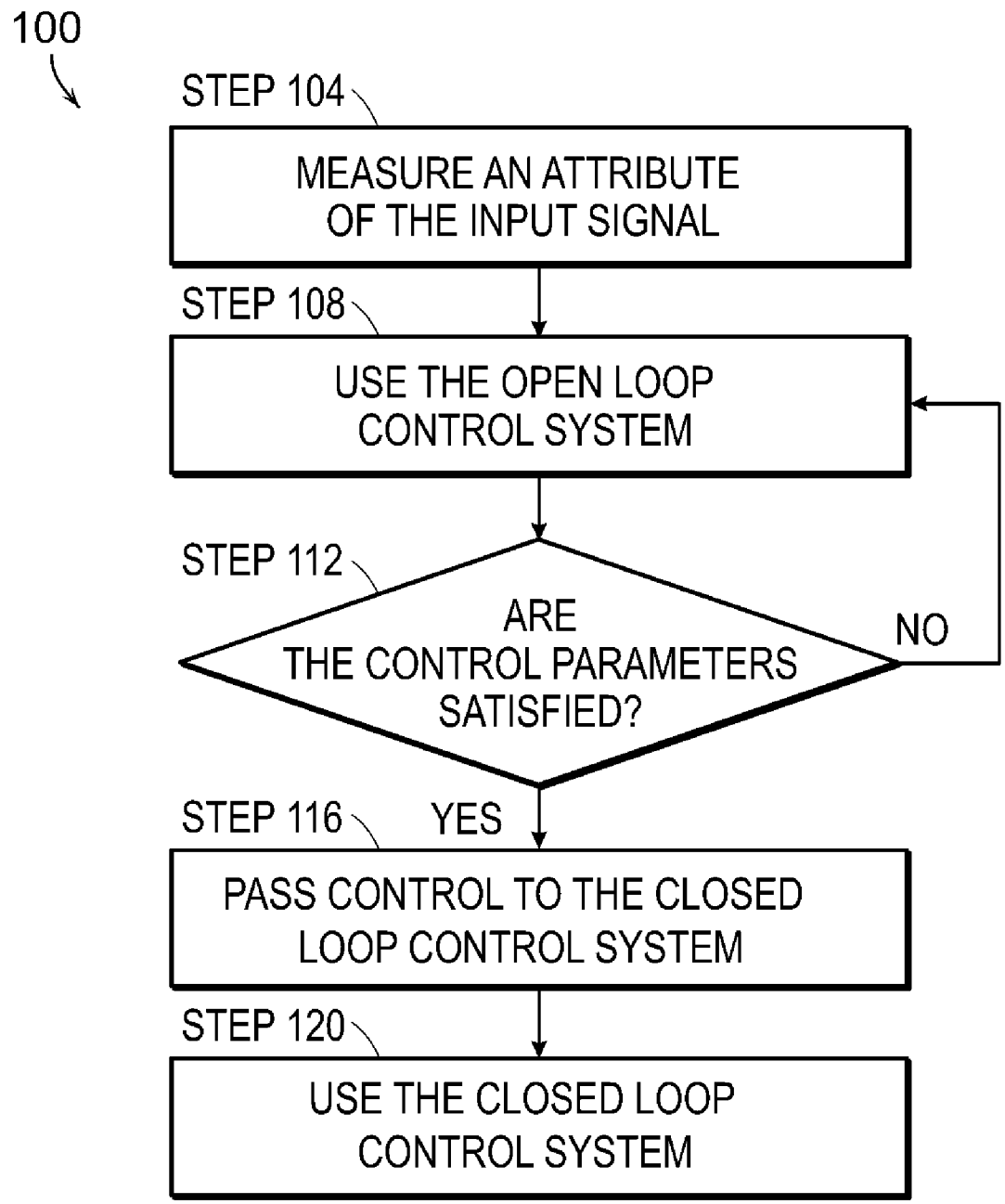
FIG. 1 is a flow diagram of a method for stabilizing an amplifier in accordance with an illustrative embodiment of the invention.

FIG. 1 depicts a method 100 for stabilizing an amplifier according to an illustrative embodiment of the invention. The method 100 may be carried out by a stabilization module that is in electrical communication with the amplifier and that includes an open loop control system and a closed loop control system. In the illustrative method of FIG. 1, an attribute of the input signal is measured (step 104), the open loop control system is used to modify at least one characteristic of an input signal received by the stabilization module (step 108), the closed loop control system is passed control (step 116) upon the satisfaction of one or more control parameters (step 112), and the closed loop control system is used to modify the at least one characteristic of the input signal (step 120). The modified input signal is provided to the amplifier during the use of the open loop control system (step 108) and during the use of the closed loop control system (step 120). The method 100 begins upon receipt, by the stabilization module, of a pulsed input signal and may be repeated on each separate instance of a pulse. The method may be implemented, for example, to stabilize an amplifier of an MRI system.

Step 104 is the measurement of an attribute of the input signal. In one embodiment, the attribute is the input power of the input signal. In another embodiment, the attribute is the voltage level of the input signal. In yet another embodiment, the attribute is the current of the input signal. The attribute is measured, in one embodiment, by an element in the stabilization module.

In step 108, the open loop control system is used to modify at least one characteristic of the input signal. For example, in one embodiment of the method of FIG. 1, the open loop control system modifies the amplitude of the input signal in step 108. In another embodiment, the open loop control system modifies the phase of the input signal in step 108. In yet another embodiment, the open loop control system modifies both the amplitude and the phase of the input signal in step 108.

The open loop control system is used to modify the at least one characteristic of the input signal based on the measured attribute of the input signal. In one embodiment, the open loop control system uses a look-up table indexed by the measured attribute to modify the at least one characteristic. For example, in one embodiment, the measured attribute is the input power of the input signal, the at least one characteristic is amplitude, and the table identifies an amount to vary the amplitude for each input power level. As described in greater detail below, the modified input signal is then provided by the open loop control system to the amplifier to stabilize the amplifier.

In step 112, one or more control parameters are checked to determine if it is an appropriate time for the open loop control system to pass control to the closed loop control system. When the one or more control parameters are satisfied, the open loop control system passes control to the closed loop control system at step 116. When, on the other hand, the control parameters are not satisfied, the open loop control system is used (step 108). In one embodiment, a control parameter is a counter value. In another embodiment, a control parameter is an elapsed period of time. In still another embodiment, a control parameter is the amplitude of the input signal. In one particular embodiment, the open loop control system checks the control parameter(s). Alternatively, the closed loop control system or another element can check the control parameter(s).

In step 116, the open loop control system can pass control to the closed loop control system. In one embodiment, described in greater detail below, the open loop control system initializes the closed loop control system for use.

After the closed loop control system is passed control, the closed loop control system is used to modify the at least one characteristic of the input signal (step 120). The closed loop control system receives a feedback signal representative of an output signal of the amplifier. In various embodiments, the at least one characteristic that is modified is the amplitude and/or the phase of the input signal. In some embodiments, the closed loop control system measures a first error between the input signal and the feedback signal. In some such embodiments, the closed loop control system also measures a second error between the input signal and the feedback signal. The closed loop control system, in these embodiments, is used to modify the at least one characteristic of the input signal based on the input power, the first error, and the second error. The modified input signal is then provided, in step 120, by the closed loop control system to the amplifier to stabilize the amplifier.

In various embodiments, the closed loop control system includes one or more filters for use in determining how to modify the at least one characteristic of the input signal. In one embodiment, a filter is used to determine an appropriate output for use in modifying the amplitude of the input signal. In another embodiment, a filter is used to determine an appropriate output for use in modifying the phase of the input signal. In one embodiment, second order filters, as documented by A. J. Viterbi, are used in the closed loop control system. In alternative embodiments, the closed loop control system uses any other type of filter, including, but not limited to, a proportional integral filter and a proportional integral derivative filter. In one embodiment, a filter includes one or more integrators. Referring again to step 116, the closed loop control system is initialized by the open loop control system in some embodiments by initializing the filters, or, more particularly, the integrators, based on outputs of the open loop control system.

Figure 2:
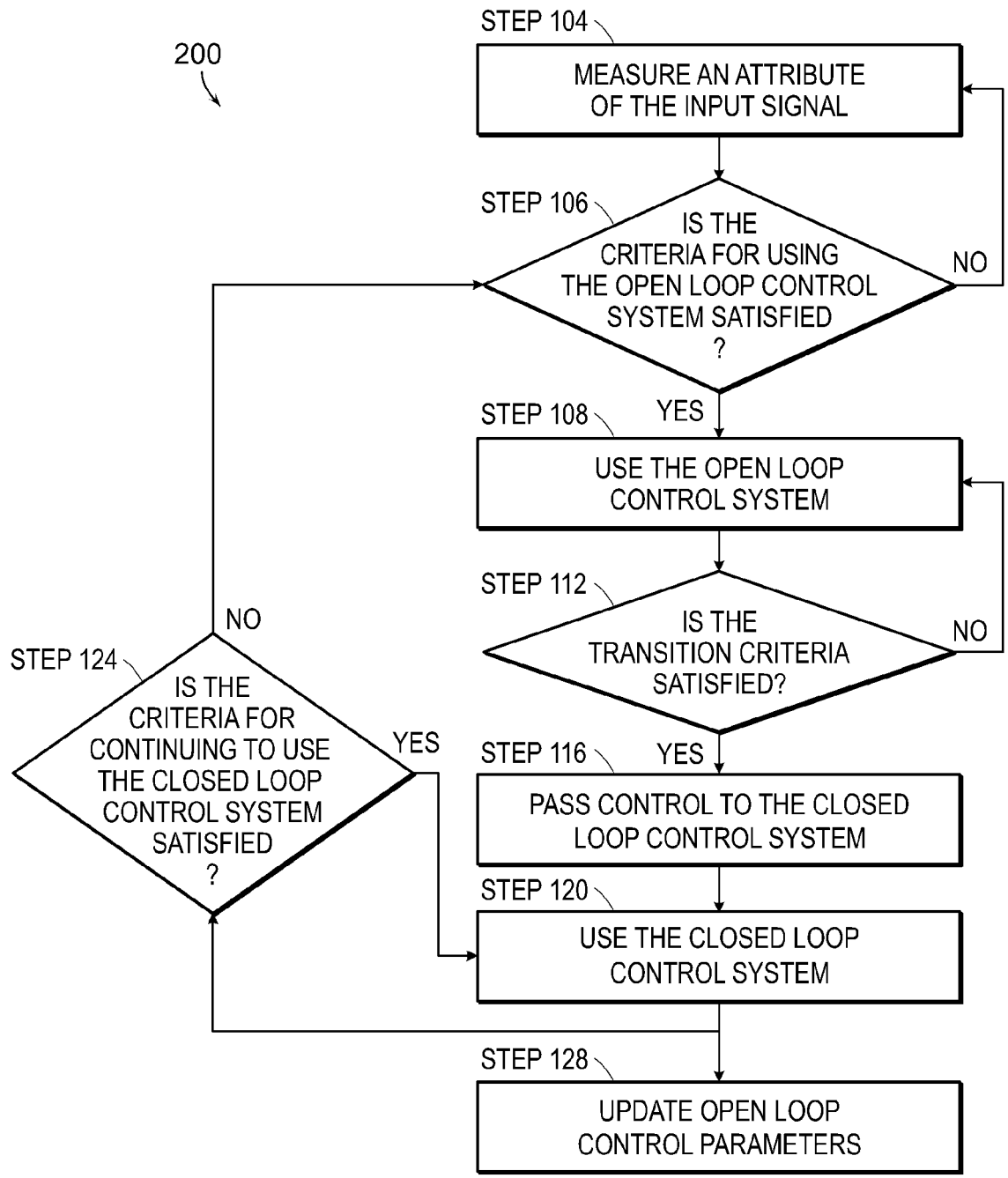
FIG. 2 is also a flow diagram of a method for stabilizing an amplifier in accordance with an illustrative embodiment of the invention.

FIG. 2 is a flowchart of a method 200 for stabilizing an amplifier in accordance with the invention. In comparison with the method 100 depicted in FIG. 1, the method 200 depicted in FIG. 2 includes three additional steps. In particular, the illustrative method of FIG. 2 determines whether the criteria for using the open loop control system is satisfied (step 106), determines whether the criteria for continuing to use the closed loop control system is satisfied (step 124), and updates open loop control parameters (step 128). Generally speaking, steps 104, 108, 112, 116, and 120 of FIG. 2 are similar to the steps in FIG. 1 with the same number, and are implemented in a similar manner.

The method of FIG. 2 begins when a stabilization module receives an input signal. The input signal may, for example, come from an external pulsed RF source. In step 104, an attribute of the input signal is measured.

At step 106, it is determined whether the one or more criteria for using the open loop control system are satisfied. In one embodiment, step 106 is performed by the open loop control system itself. In order embodiments, another element in the stabilization module performs step 106. In some embodiments, one criterion corresponds to the measured attribute of the input signal. For example, in one such embodiment, when the input power of the input signal is above a threshold level, the open loop control system is used at step 108. On the other hand, if the input power of the input signal is below the threshold level in that embodiment, the open loop control system is not used and the input power of the input signal is again measured at step 104. Step 104 could be repeated until the input power of the input signal rises above the threshold level. In embodiments, one criteria used in determining whether to use the open loop control system is whether the amplifier is active. More than one criteria may be considered in determining whether to use the open loop control system.

In step 108, the open loop control system is used to modify a characteristic of the input signal and to minimize an amplifier non-linearity associated with that characteristic. Thus, in one particular embodiment, the open loop control system may initially be used, at step 108, to modify a phase of the input signal and minimize a phase non-linearity of the amplifier. This step may be implemented in a way similar to the description of step 108 in FIG. 1.

At step 112, it is decided whether to transition from using the open loop control system to using the closed loop control system. In one embodiment, for example, the transition occurs after the open loop control system is used for a predetermined period of time during which an input power of the input signal is above a threshold level. If the criteria is satisfied in step 112, the closed loop control system is passed control in step 116. In one embodiment, the open loop control system initializes the closed loop control system for use. The initialization may be considered part of the transition from using the open loop control system to using the closed loop control system.

In step 120, the closed loop control system is used to modify a characteristic of the input signal and to minimize a non-linearity of the amplifier associated with that characteristic. In one embodiment, for example, the closed loop control system modifies a phase of the input signal and minimizes a phase non-linearity of the amplifier.

At step 124, it is determined whether the criteria for continuing to use the closed loop control system is satisfied. The determination is made, in some embodiments, by considering the measured attribute of the input signal. For example, in one embodiment, when the input power of the input signal is above a threshold level, the closed loop control system will continue to be used at step 120. On the other hand, if the input power of the input signal is below the threshold value in that embodiment, the closed loop control system will not be used and step 106 will be performed. In other embodiments, other criteria can, alternatively or additionally, be used by the stabilization module in determining whether the closed loop control system should continue to be used. For example, in one particular embodiment, as further discussed below, whether or not the amplifier is active is considered in addition to the input power of the input signal in determining whether to use the closed loop control system.

At step 128, in the embodiment of the invention illustrated by FIG. 2, the open loop control parameters are updated. In embodiments, described in greater detail below with respect to FIG. 6, a calibration routine is run to update a look-up table used by the open loop control system. In one such embodiment, the calibration routine updates the look-up table based on outputs of the closed loop control system.

Figure 3:
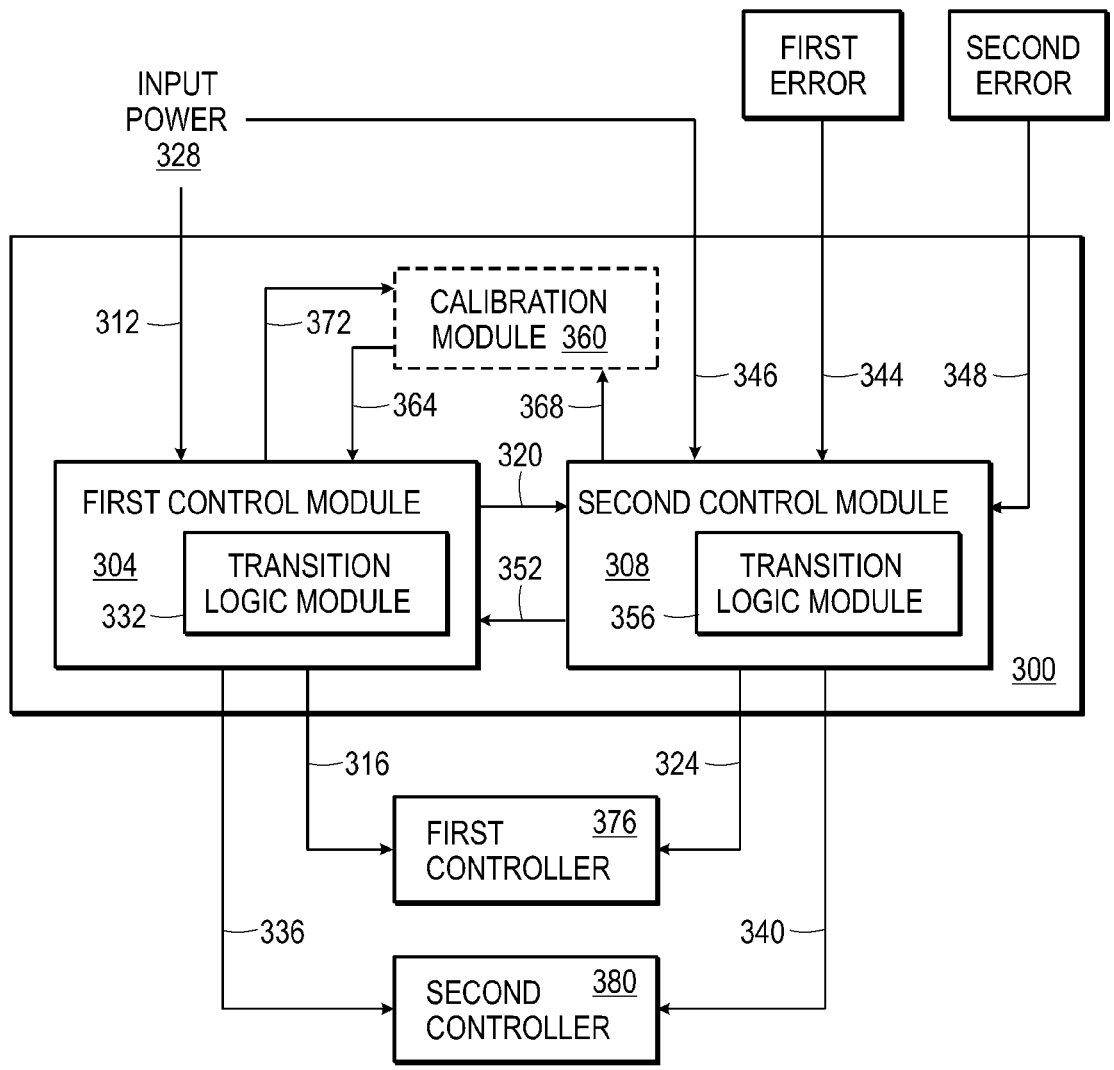
FIG. 3 is a block diagram of a system for use in a stabilization module for stabilizing an amplifier in accordance with an illustrative embodiment of the invention.

FIG. 3 depicts a system 300 for use in a stabilization module for stabilizing an amplifier according to an illustrative embodiment of the invention. The system 300 includes a first control module 304 and a second control module 308. In one embodiment, each of the first control module 304 and the second control module 308 is implemented as a software program. Alternatively, in another embodiment, the first control module 304 and/or the second control module 308 are/is implemented as one or more hardware devices. In one embodiment, the first control module 304 uses an open loop control routine and the second control module uses a closed loop control routine. In one embodiment, the hardware device is an application-specific integrated circuit (ASIC). In another embodiment, the hardware device is a field-programmable gate array (FPGA). In other embodiments, another type of hardware device is used.

The first control module 308 of system 300 is for performing three functions: (a) receiving a first signal 312 representative of an input signal received by the stabilization module, (b) generating a second signal 316 capable of being used to modify a first characteristic of the input signal using the open loop control routine, and (c) sending a third signal 320 capable of being used to pass control to the second control module 308. The second control module 308 of the system 300 is for generating a fourth signal 324 capable of being used to modify the first characteristic of the input signal using the closed loop control routine.

In some embodiments, the first control module is capable of generating the second signal 316 to account, as further described below, for a non-linearity introduced by the stabilization module. In some embodiments, the second control module 308 is capable of generating the fourth signal 324 to account, as further described below, for a non-linearity introduced by the stabilization module hardware.

In some embodiments, the first control module 304 is capable of generating a fifth signal 336 capable of being used to modify a second characteristic of the input signal using the open loop control routine. In a related embodiment, the second control module 308 is capable of generating a sixth signal 340 capable of being used to modify the second characteristic of the input signal using the closed loop control routine.

In one embodiment, a first controller 376 is used to modify the first characteristic of the input signal. In another embodiment, a second controller 380 is used to modify the second characteristic of the input signal.

In some embodiments, the first characteristic of the input signal is an amplitude of the input signal and the second characteristic of the input signal is a phase of the input signal. In an alternative embodiment, the first characteristic of the input signal is a phase of the input signal and the second characteristic of the input signal is an amplitude of the input signal.

In some embodiments, the first control module 304 includes a transition logic module 332. In some such embodiments, the transition logic module 332 checks one or more criteria and determines if the open loop control routine will be used. In one such embodiment, the transition logic module 332 is capable of determining whether the amplifier is active. In another such embodiment, the transition logic module 332 is capable of determining if an input power 328 of the input signal is above a threshold level. If so, the first control module 304 will generate, using the open loop control routine, the second signal 316 capable of being used to modify the first characteristic of the input signal. In some such embodiments, the transition logic module 332 checks one or more criteria and determines if control will be passed to the second control module 308. In one such embodiment, the transition logic module 332 is capable of determining if the first control module 304 has been using the open loop control routine for a predetermined period of time during which the input power 328 of the input signal was above a threshold level. If so, the first control module 304 will send the third signal 320 to the second control module 308.

In a further embodiment, the second control module 308 is capable of receiving a signal 346 representative of an input signal received by the stabilization module and one or more error signals 344 and 348. An error signal in one such embodiment may represent an amplitude error between the input signal received by the stabilization module and a feedback signal representative of an output signal of the amplifier. An error signal, in another such embodiment, may represent a phase error between the input signal and the feedback signal. The second control module 308, in one embodiment, adjusts the one or more error signals 344 and 348 to compensate, as further described below, for a non-linearity present in a first error signal and/or in a second error signal.

In some embodiments, the second control module 308 includes a transition logic module 356. In some such embodiments, the transition logic module 356 checks one or more criteria and determines if the closed loop control routine will be used or whether control will be passed to the first control module 304, via a connection 352. In one such embodiment, the transition logic module 356 is capable of determining whether the amplifier is active. In another such embodiment, the transition logic module 332 is capable of determining if an input power 328 of the input signal is above a threshold level. If not, the second control module 308 will pass control, via the connection 352, to the first control module 304.

In another embodiment, the system 300 includes a calibration module 360. The calibration module 360 may be implemented as a software program and may use a calibration routine. Alternatively, in another embodiment, the calibration module 360 is implemented as a hardware device. In one embodiment, the hardware device is an ASIC. In another embodiment, the hardware device is an FPGA. In other embodiments, another type of hardware device is used.

The calibration module 360, in one embodiment, is capable of generating entries for initializing one or more filters used by the second control module 308. The first control module 304 can then retrieve, via a connection 364, the entries from the calibration module 360 and use the entries to initialize, by using transition logic module 332, the one or more filters in the second control module 308.

In another embodiment, the calibration module 360 is capable of generating a first value, representing an amount to modify the first characteristic of the input signal, and a second value, representing an amount to modify the second characteristic of the input signal. The first control module 304 is capable of retrieving, via the connection 364, the first value and the second value from the calibration module 360. The first control module 304 is capable of using the first value to generate the second signal 316 and of using the second value to generate the fifth signal 336.

The calibration module 360 is, in another embodiment, capable of updating the first value and the second value based on outputs received, via a connection 368, from the second control module 308. In a further embodiment, the calibration module 360 uses an algorithm to generate the first value and the second value to account, as further described below, for at least one non-linearity introduced by the stabilization module hardware. In further embodiments, the calibration module 360 can receive, via a connection 372, data from the first control module 304.

Figure 4:
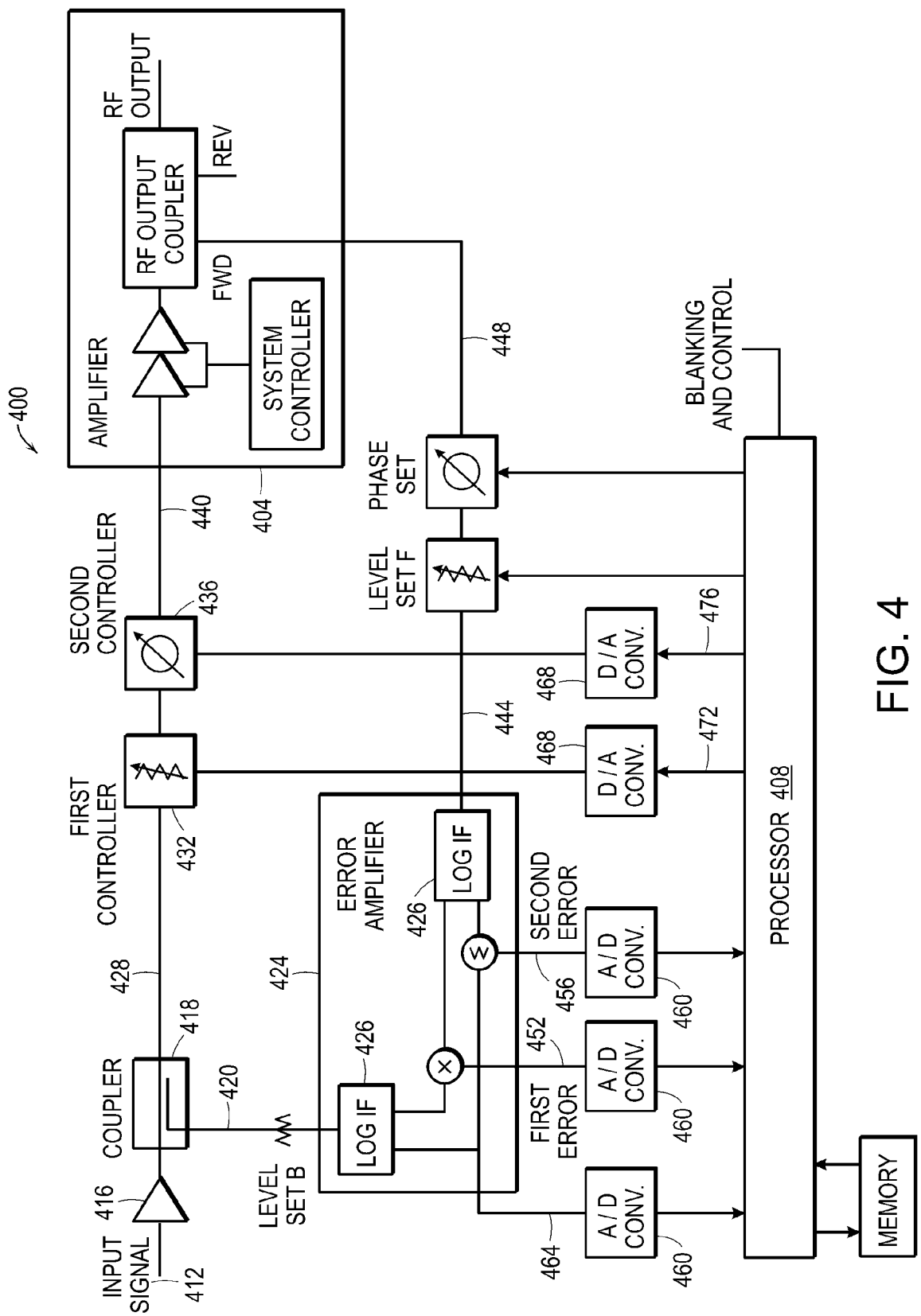
FIG. 4 is a circuit diagram of a stabilization module for stabilizing an amplifier in accordance with an illustrative embodiment of the invention.

FIG. 4 depicts a stabilization module 400 for stabilizing an amplifier 404 in accordance with an illustrative embodiment of the invention. In the illustrative embodiment shown, the stabilization module 400, which is in electrical communication with the amplifier 404, includes a combination of hardware and software. The software runs on the processor 408.

The stabilization module 400 receives, from an external source (e.g., a power supply), an input signal 412 at a pre-amplifier 416. In one embodiment, the input signal 412 is a pulsed RF input signal. A directional coupler 418 then samples the pre-amplified input signal 412. A first sample 420 is input to an error amplifier 424, while a second sample 428 is input to a first controller 432 and to a second controller 436. In one embodiment, the first controller 432 is a gain controller, used to modify an amplitude of the input signal 412. In another embodiment, the second controller 436 is a phase shifter, used to modify a phase of the input signal 412. As described below, a modified input signal 440 is output by the first controller 432 and the second controller 436 and input to the amplifier 404.

In one embodiment, the amplifier 404 is a pulsed RF amplifier. In another embodiment, the amplifier 404 is used in an MRI system. A feedback signal 444, representative of an output signal 448 of the amplifier 404, is also input to the error amplifier 424. In one embodiment, the error amplifier includes logarithmic intermediate frequency (LOG IF) amplifiers 426 for amplifying the first sample 420 and the feedback signal 444. The error amplifier 424 generates a first error signal 452 and a second error signal 456. The first error signal 452/second error signal 456 is, in one embodiment, representative of an amplitude error between the input signal 412 and the feedback signal 444. In another embodiment, the first error signal 452 second error signal 456 is representative of a phase error between the input signal 412 and the feedback signal 444.

In one embodiment, the stabilization module 400 includes three analog to digital (A/D) converters 460. The A/D converters input digitized representations of a first signal 464 representative of the input signal 412, the first error signal 452, and the second error signal 456 to the processor 408. The processor 408 performs signal processing to generate the control signals that are outputted to the digital to analog (D/A) converters 468. In one embodiment, the processor 408 includes the first control module 304, the second control module 308, and the calibration module 360. In one embodiment, the processor executes the first control module 304 to implement an open loop control routine. In another embodiment, the processor executes the second control module 308 to implement a closed loop control routine. In yet another embodiment, the digital control system, including the A/D converters 460, the processor 408, and the D/A converters 468, is entirely replaced by an analog control system. Alternatively, the digital control system is only partly replaced by an analog control system.

In one embodiment, when the processor 408 implements the open loop control routine, the first control module 304 generates a first signal 472 capable of being used to modify a first characteristic of the input signal 412 and a second signal 476 capable of being used to modify a second characteristic of the input signal 412. In another embodiment, when the processor implements the closed loop control routine, the second control module 308 generates the first signal 472 capable of being used to modify the first characteristic of the input signal 412 and the second signal 476 capable of being used to modify the second characteristic of the input signal 412. In one embodiment, the first characteristic of the input signal 412 is the amplitude of the input signal 412 and the second characteristic of the input signal 412 is the phase of the input signal 412.

In one embodiment, the D/A converters 468 input analog representations of the signals 472 and 476 to the controllers 432 and 436, respectively. In one embodiment, the first controller 432 uses the analog representation of the first signal 472 to modify the amplitude of the input signal and thereby minimize an amplitude non-linearity of the amplifier 404. In another embodiment, the second controller 436 uses the analog representation of the second signal 476 to modify the phase of the input signal and thereby minimize the phase non-linearity of the amplifier 404. As described above, the modified input signal 440 is then provided to the amplifier 404.

Figure 5:
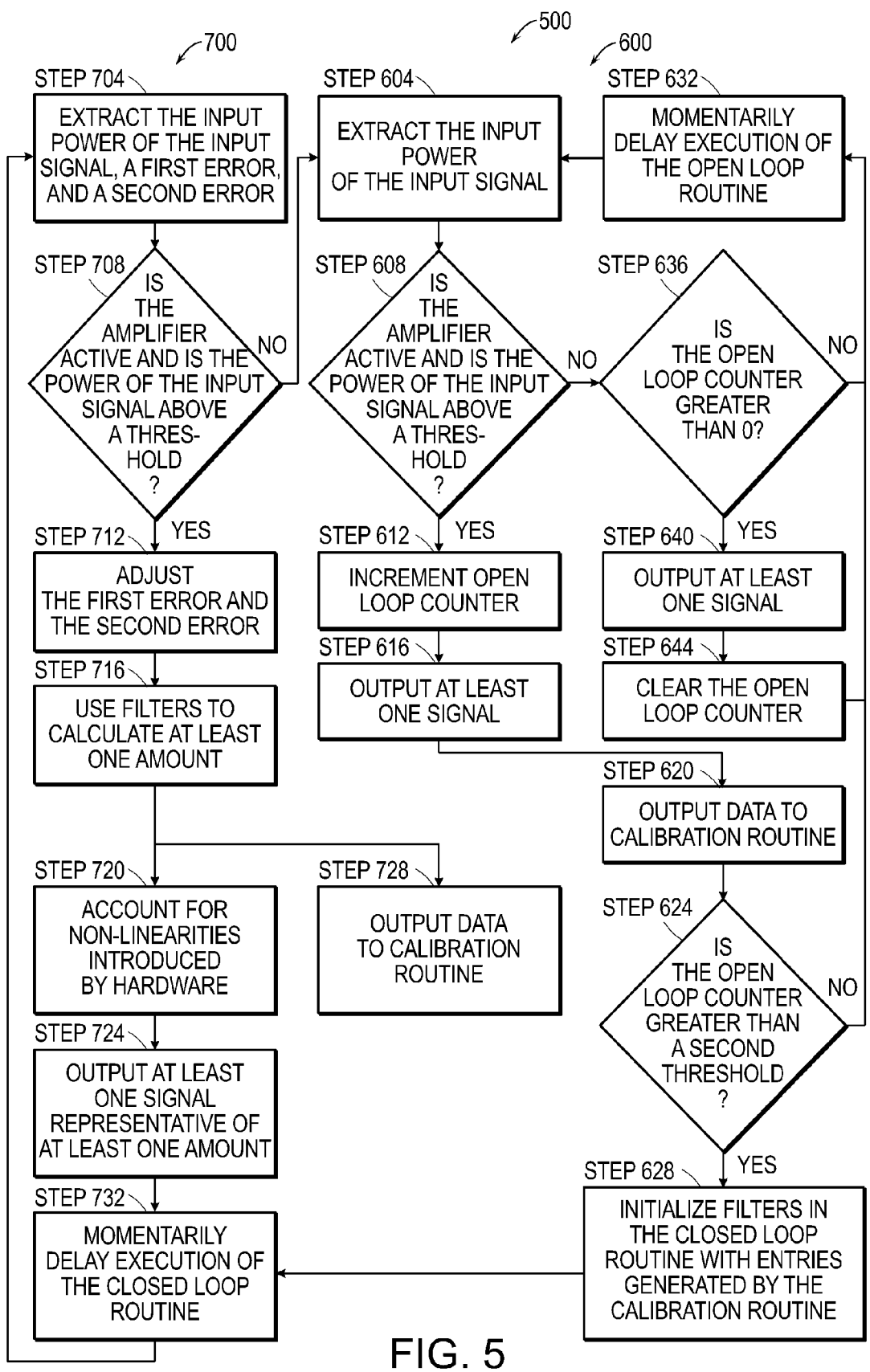
FIG. 5 is a flow diagram of a method, including an open loop control routine and a closed loop control routine, for stabilizing an amplifier in accordance with an illustrative embodiment of the invention.

FIG. 5 depicts one embodiment of a software routine 500, including an open loop control routine 600 and a closed loop control routine 700. In one embodiment, the open loop control routine 600 is executed by the first control module 304. In another embodiment, the closed loop control routine 700 is executed by the second control module 308. In one embodiment, when the input signal is first received by the stabilization module (e.g., when the external source, such as, for example, the power supply, is first turned on), the software routine 500 defaults to using the open loop control routine 600.

At step 604, the open loop control routine 600 extracts the input power of the input signal received by the stabilization module. At step 608, the open loop routine 600 then determines whether the criteria for using the open loop control routine 600 is satisfied by determining whether the amplifier is active (i.e., enabled) and whether the input power of the input signal is above a first threshold. If the amplifier is enabled and the input power of the input signal is above the first threshold, the open loop control routine 600 increments an open loop counter at step 612.

At step 616, the open loop control routine 600 outputs at least one signal capable of being used to modify at least one characteristic of the input signal. In one embodiment, the open loop control routine 600 outputs two signals, one capable of being used to modify an amplitude of the input signal and one capable of being used to modify a phase of the input signal. In another embodiment, the open loop control routine 600 outputs only one of the two aforementioned signals. In one embodiment, the open loop control routine 600 uses a look-up table created, for example as discussed below with respect to FIG. 6, by a calibration routine to generate the at least one signal to be outputted. The look-up table in such an embodiment can be indexed by the input power of the input signal. Based on the input power of the input signal extracted at step 604, the open loop control routine 600 looks-up a corresponding table value. The value may be, for example, indicative of the current or the voltage of the signal to be outputted, at step 616, by the open loop control routine 600. The open loop control routine 600 outputs such a signal at step 616. In another embodiment, the open loop control routine 600 uses a look-up array created, for example as discussed below with respect to FIG. 6, by a calibration routine to generate the at least one signal to be outputted. The look-up array in such an embodiment can be indexed by the input power of the input signal. Based on the input power of the input signal extracted at step 604, the open loop control routine 600 looks-up a corresponding table entry. The entry may be, for example, indicative of an amount to modify an amplitude or a phase of the input signal. In such an embodiment, the open loop control routine 600 runs the same algorithm that is run by the closed loop control routine 700 at step 720, as described below, to adjust the entry to account for a non-linearity introduced by the hardware of the stabilization module. The open loop control routine 600 then uses the adjusted entry to generate the at least one signal outputted at step 616.

In embodiments in accordance with FIG. 5, the open loop control routine 600 outputs, at step 620, data to the calibration routine by writing the data to a calibration array. At a minimum, the open loop control routine 600, in such embodiments, outputs an open loop mode flag to the calibration routine. In one embodiment, the open loop control routine 600 also outputs the input power of the input signal to the calibration routine. In another embodiment, the value of the open loop counter is outputted by the open loop control routine 600 to the calibration routine.

At step 624, the open loop control routine 600 determines whether the open loop counter is greater than a second threshold. If yes, the open loop control routine 600 proceeds to step 628. Otherwise, the open loop control routine 600 proceeds to step 632, where execution of the open loop routine 600 is momentarily delayed before the open loop control routine 600 again extracts the input power of the input signal at step 604.

The second threshold of step 624 and the delay present in step 632 ensure that the open loop control routine 600 is executed for a minimum period of time before control is passed to the closed loop control routine 700 at step 628. Consequently, the amplifier is given a period of time to settle before the software routine 500 transitions from the open loop routine 600 to the closed loop routine 700. In one embodiment, the second threshold of step 624 is tunable. In another embodiment, the delay present in step 632 is tunable.

Referring again to step 608, if the amplifier is inactive or the power level of the input signal is below a first threshold, the open loop control routine 600 proceeds to step 636. At step 636, the open loop control routine 600 determines whether the open loop counter is greater than 0. If not, the open loop control routine 600 proceeds to step 632. If so, the open loop control routine 600 proceeds to step 640. At step 640, the open loop control routine outputs at least one signal capable of being used to modify the at least one characteristic of the input signal. In one embodiment, this is done by using the look-up table, as discussed above with respect to step 616.

At low input power levels, most amplifiers behave linearly. The first threshold level of step 608 is, in one embodiment, chosen in view of this fact, i.e., the first threshold level is chosen such that the amplifier behaves linearly at input power levels below the chosen first threshold level. In such a fashion, the actual input power of the input signal, so long as it is below the first threshold, will not be relevant to outputting the at least one signal at step 640. The same at least one signal, where the input power of the input signal, regardless of its actual value, is below the first threshold, may, therefore, be outputted at step 640. Consequently, step 640 need only be executed a single time. To ensure this is the case, the open loop counter is cleared at step 644.

Referring again to step 628, after the open loop control routine 600 determines that it was executed for a pre-determined period of time during which the input power of the input signal was above the first threshold level (i.e., steps 604, 608, 612, 616, 620, 624, and 632 were continuously executed for a predetermined period of time because the open loop control routine 600 always proceeded from step 608 to step 612), the open loop control routine 600 passes control to the closed loop control routine 700. In one embodiment, the open loop control routine 600 initializes, at step 628, filters for use, at step 716, by the closed loop control routine 700 with entries generated, for example as described below with respect to FIG. 6, by the calibration routine. The entries can correspond to the one or more signals last outputted by the open loop routine at step 616. In such a fashion, the closed loop control routine begins execution at the same settings that the open loop control routine left off at. In one embodiment, an entry represents an amount by which to increase or decrease the amplitude of the input signal. In another embodiment, an entry represents an amount by which to shift the phase of the input signal. In one embodiment, the entries are stored by the calibration routine in, for example, one or more look-up arrays. These arrays may be indexed by input power of the input signal. Thus, based on the input power of the input signal extracted at step 604, the open loop control routine 600 can look up and use corresponding entries generated by the calibration routine to initialize the filters of the closed loop control routine 700.

After the open loop control routine 600 has passed control to the closed loop control routine 700, there is a delay at step 732. In one embodiment, the period of delay in step 732 is adjustable. Following the delay of step 732, the closed loop control routine 700 can extract a plurality of signals at step 704. In one embodiment, these signals include the input power of the input signal, a first error between the input signal and a feedback signal representative of the output signal of the amplifier, and a second error between the input signal and the feedback signal. In one such embodiment, the first error is an amplitude error between the input signal and the feedback signal and the second error is a phase error between the input signal and the feedback signal.

At step 708, the closed loop routine 700 determines whether the one or more criteria for using the closed loop control routine 700 is satisfied. In one embodiment, the closed loop control routine 700 determines whether the amplifier is active (i.e., enabled or unblanked) and whether the input power of the input signal is above a threshold. If the criteria is satisfied, the closed loop control routine 700 proceeds to step 712. If not, the software routine 500 returns to the open loop control routine 600 and extracts the input power of the input signal at step 604. In one embodiment, the value of the threshold used in the closed loop control routine 700 is less than the value of the first threshold used in the open loop control routine 600 to allow for a level of hysteresis and to prevent the software routine 500 from toggling between the open loop control routine 600 and the closed loop control routine 700. Were the first threshold and the threshold used in the closed loop control routine 700 equal, and were the input power of the input signal varying slightly about those thresholds, the software routine 500 could toggle between the open loop control routine 600 and the closed loop control routine 700.

As will be readily understood by one skilled in the art, the hardware used by the stabilization module to generate signals representative of the first error and/or the second error will be imperfect. The hardware will, therefore, overshoot or understood the true values for the first error and/or the second error. In fact, the hardware will introduce a predictable variation from the true values of the first error and/or the second error for each input power level of the input signal. Accordingly, in one embodiment, the closed loop control routine adjusts, at step 712, the first error and the second error measurements provided at step 704 by the stabilization module hardware. The closed loop control routine 700, in one embodiment, uses, at step 712, a look-up chart indexed by input power level of the input signal. For each input power level, the look-up chart lists the expected overshoot or undershoot of the true values for the first error and/or the second error. By adding the expected overshoot or undershoot to the first error and/or the second error measurements provided by the hardware, the closed loop control routine 700 therefore derives the true values for the first error and/or the second error.

Once the closed loop control routine 700 has appropriately adjusted the first error and/or the second error at step 712, the closed loop control routine determines, at step 716, at least one amount to modify at least one characteristic of the input signal. For example, in one embodiment, the closed loop control routine 700 determines two amounts: one to modify an amplitude of the input signal and one to modify a phase of the input signal. In another embodiment, the closed loop control routine 700 determines only one of the two aforementioned amounts. In one embodiment, as discussed above, the closed loop control routine 700 uses second order filters, as documented by A. J. Viterbi, to determine the at least one amount. Alternatively, any style of filter, such as, for example, a proportional integral filter and/or a proportional integral derivative filter, can be used by the closed loop control routine 700 at step 716 to determine the at least one amount.

Prior to step 724, the closed loop control routine 700, of some embodiments, accounts, at step 720, for the non-linearities introduced by the hardware of the stabilization module. In one such embodiment, the closed loop control routine 700 runs an algorithm to adjust the desired amounts determined in step 716. The adjusted amounts are then used to generate the at least one signal outputted at step 724. The algorithm is implemented to choose the adjusted amounts so that the at least one signal outputted at step 724, following any distortion brought about by the hardware non-linearities, is in fact representative of the desired amounts determined at step 716. In such a fashion, the algorithm compensates for the non-linearities of the stabilization module hardware.

After outputting, at step 724, the at least one signal, execution of the closed loop control routine is again delayed at step 732 before the closed loop control routine returns to step 704.

At step 728, the closed loop control routine 700 outputs data to the calibration routine by writing the data to the calibration array. For example, the closed loop control routine 700 outputs the input power of the input signal, the first error, the second error, the at least one amount determined at step 716, and a closed loop mode flag to the calibration routine.

Figure 6:
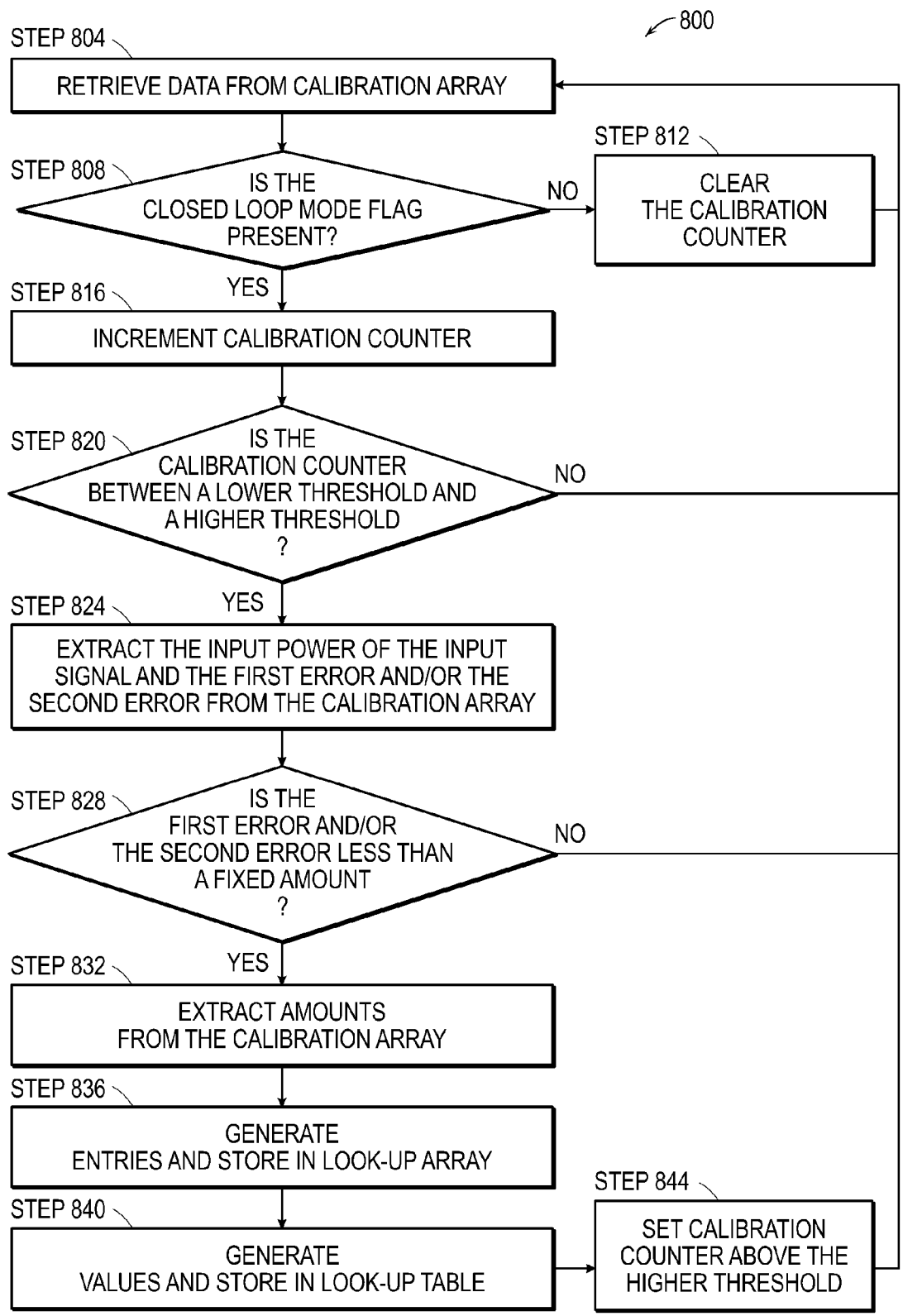
FIG. 6 is a flow diagram of a calibration routine that is used in one embodiment of the invention.

FIG. 6 depicts one embodiment of a calibration routine 800 according to an illustrative embodiment of the invention. In one embodiment, the calibration routine 800 is a software routine executed by the calibration module 360. The calibration routine 800 is executed, in one embodiment, when both the open loop control routine 600 and the closed loop control routine 700 are idle. For example, the calibration routine 800 is executed during the delay introduced by steps 632 and/or 732. As described in detail below, the calibration routine 800 enables the open loop control routine 600 to learn from the closed loop control routine 700, such that the open loop control routine's 600 performance is improved over time.

At step 804, the calibration routine 800 retrieves the data previously written to the calibration array by the open loop control routine 600 at step 620 and the closed loop control routine 700 at step 728. The calibration routine 800 then determines, at step 808, whether the closed loop control routine 700 is running. For example, in one embodiment, the calibration routine 800 checks to see if the closed loop mode flag is present. If not (i.e., the open loop mode flag is present), the calibration routine 800 clears a calibration counter at step 812 and proceeds to retrieve further data from the calibration array at step 804. If the closed loop control routine 700 is running, the calibration routine 800 increments the calibration counter at step 816 and proceeds to process the data. In this fashion, the calibration routine 800 only processes data written to the calibration array by the closed loop control routine 700.

At step 820, the calibration routine 800 determines whether the calibration counter is between a lower threshold and a higher threshold. If not, the calibration routine 800 returns to step 804 to retrieve further data from the calibration array. If so, the calibration routine 800 extracts, at step 824, the input power of the input signal and the first error and/or the second error from the calibration array. By ensuring that the calibration counter is greater than a lower threshold before proceeding to step 824, the calibration routine 800 ensures that it does not processes the data first written to the calibration array by the closed loop control routine 700. Rather, the calibration routine 800 is sure to process data written by the closed loop control routine 700 to the calibration array after the closed loop control routine 700 has run for a period of time (i.e., when the amplifier is more stable). Similarly, by ensuring that the calibration counter is less than a higher threshold before proceeding to step 824, the calibration routine 800 ensures that it processes data written to the calibration array by the closed loop control routine 700 near the start of the closed loop control routine 800 (e.g., near the start of a pulse).

At step 828, the calibration routine 800 determines whether the first error and/or the second error is less than a fixed amount. If so, the amplifier has stabilized and the calibration routine proceeds to step 832. Otherwise, the calibration routine 800 proceeds to retrieve further data from the calibration array at step 804. At step 832, the calibration routine 800 extracts, from the calibration array, the amounts written to it by the closed loop control routine 700.

The calibration routine 800 generates, at step 836, the entries used by the open loop control routine 600, at step 628, to initialize the filters in the closed loop control routine 700. The entries may be indexed by input power of the input signal and stored in a look-up array. In one embodiment, the calibration routine 800 uses a weighted filter to generate the entries. The calibration routine 800, for example, generates the current entry for a particular input power of the input signal by adding a weighted value of the extracted amount to a weighted value of the previous entry appearing in the look-up array at that input power level.

At step 840, the calibration routine 800 uses the entries generated at step 836 to determine values for use by the open loop control routine 600 at step 616. In doing so, the calibration routine 800 accounts for the non-linearities introduced by the hardware of the stabilization module. For example, the calibration routine 800 runs the same algorithm that is run by the closed loop control routine 700 at step 720. The values generated by the calibration routine 800 are stored in the look-up table.

At step 844, the calibration routine 800 sets the calibration counter above the higher threshold of step 820. In such a fashion, it is ensured that the calibration routine 800 only generates the entries and the values once per pulse.

The present invention may be provided as one or more computer-readable programs embodied on or in one or more articles of manufacture. The article of manufacture may be a floppy disk, a hard disk, a CD ROM, a flash memory card, a PROM, a RAM, a ROM, or a magnetic tape. In general, the computer-readable programs may be implemented in any programming language. Some examples of languages that can be used include C, C++, or JAVA. The software programs may be stored on or in one or more articles of manufacture as object code.

Figures 2, 7A:
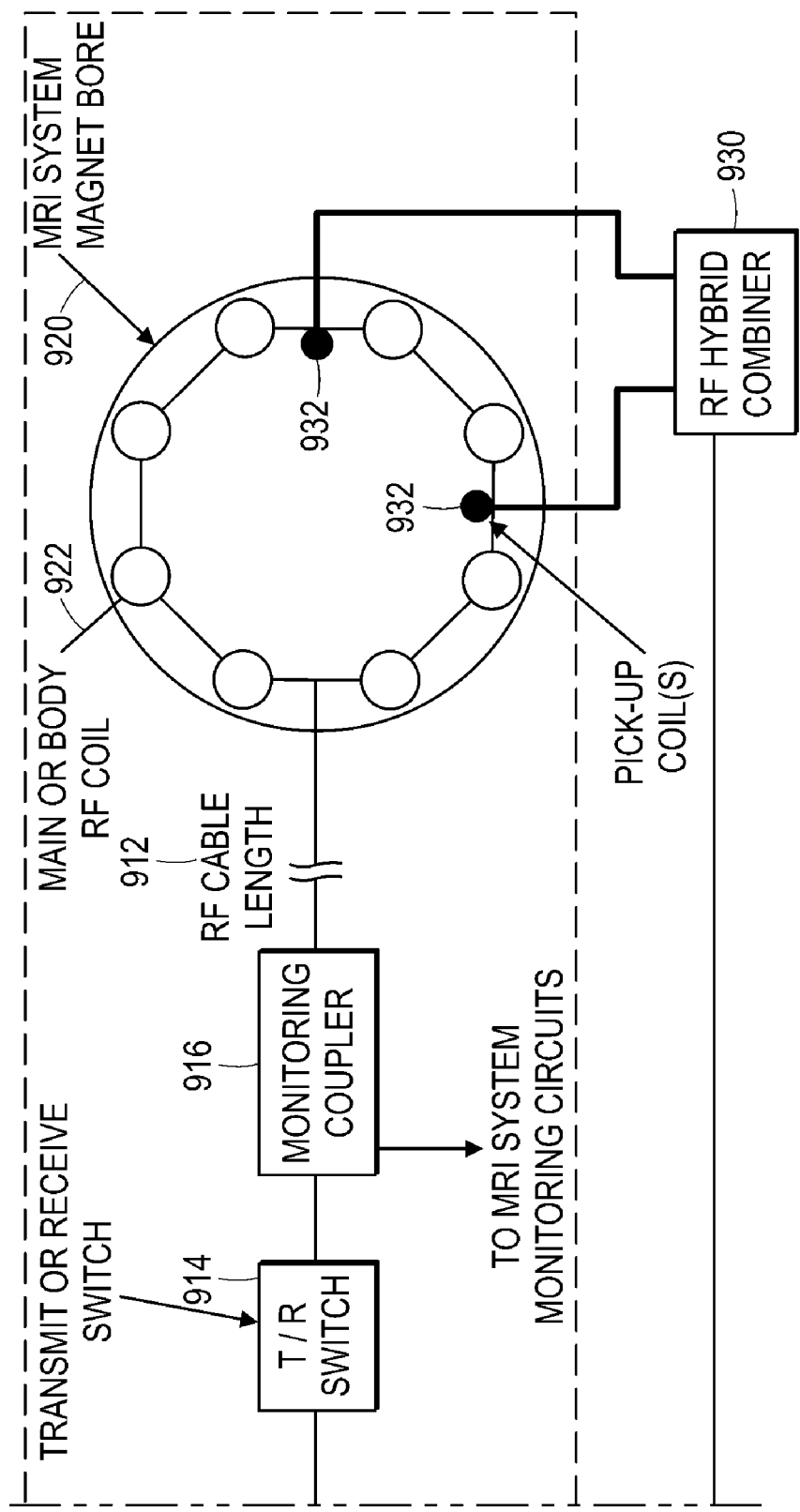
FIG. 7A is a circuit/block diagram of a closed loop, fast feedback magnetic resonance imaging (MRI) transmit stabilization module.

FIG. 7A depicts a stabilization module 900 for stabilizing an MRI power delivery system (RF transmit chain/path) 910. Generally, the stabilization module 900 moves the feedback loop from the RF output coupler (forward port) of the amplifier 404 (FIG. 4) to a sample of the RF signal from the MRI system magnetic bore 920. The MRI power delivery system 910 includes, but is not limited too, an amplifier 404, various lengths of RF cable 912, a transmit/receive (T/R) switch 914, a monitoring coupler 916, and the MRI system magnetic bore 920. The magnetic bore 920 includes a plurality of main or body RF coils 922. In one embodiment, the stabilization module 900 includes, but is not limited too, a processor 408, a coupler 418, an error amplifier 424, first and second controllers 432, 436, A/D converters 460, D/A converters 468, level and phase sets, and an RF hybrid combiner 930 that senses the electromagnetic field strength in the magnetic bore 920 though a pick-up coil or antenna 932. It should be understood that there can be from one to a plurality of pick-up coils or antennas 932 located within or in close proximity to the magnetic bore 920. The placement of RF hybrid combiner 930, its connection to 448, and associated pick-up coils 932 in the magnetic bore 920 allows the system 900 to correct in real time for gain and phase errors in all of the components in the RF transmit path 910. These errors can be caused by, but are not limited too, temperature, voltage standing wave ratio (VSWR), patient size, mechanical movement, and electrical non-linearities, all of which can change the RF path over time.

In the illustrative embodiment shown, the stabilization module 900, which is in electrical communication with the MRI power delivery system 910, includes a combination of hardware and software. The software runs on the processor 408.

Like the stabilization module 400 of FIG. 4, the stabilization module 900 receives, from an external source (e.g., a signal generator), an input signal 412 at a pre-amplifier 416. In one embodiment, the input signal 412 is a pulsed RF input signal. A directional coupler 418 then samples the pre-amplified input signal 412. A first sample 420 is input to an error amplifier 424, while a second sample 428 is input to a first controller 432 and to a second controller 436. In one embodiment, the first controller 432 is a gain controller, used to modify an amplitude of the input signal 412. In another embodiment, the second controller 436 is a phase shifter, used to modify a phase of the input signal 412. As described below, a modified input signal 440 is output by the first controller 432 and the second controller 436 and input to the amplifier 404.

In one embodiment, the amplifier 404 is used in the MRI power delivery system 910. A feedback signal 444, representative of an output signal 448 of the RF hybrid coupler 930, is also input to the error amplifier 424. In one embodiment, the error amplifier 424 includes logarithmic intermediate frequency (LOG IF) amplifiers 426 for amplifying the first sample 420 and the feedback signal 444. The error amplifier 424 generates a first error signal 452 and a second error signal 456. The first error signal 452/second error signal 456 is, in one embodiment, representative of an amplitude error between the input signal 412 and the feedback signal 444. In another embodiment, the first error signal 452/second error signal 456 is representative of a phase error between the input signal 412 and the feedback signal 444.

In one embodiment, the stabilization module 900 includes three analog to digital (A/D) converters 460. The A/D converters 460 input digitized representations of a first signal 464 representative of the input signal 412, the first error signal 452, and the second error signal 456 to the processor 408. The processor 408 performs signal processing to generate the control signals that are outputted to the digital to analog (D/A) converters 468. In one embodiment, the processor 408, as shown in FIG. 3, utilizes the second control module 308 and the calibration module 360. In one embodiment, the processor 408 executes the second control module 308 to implement a closed loop control routine. In yet another embodiment, the digital control system, including the A/D converters 460, the processor 408, and the D/A converters 468, is entirely replaced by an analog control system. Alternatively, the digital control system is only partly replaced by an analog control system.

In one embodiment, when the processor 408 implements the open and closed loop control routines, the second control module 308 generates the first signal 472 capable of being used to modify the first characteristic of the input signal 412 and the second signal 476 capable of being used to modify the second characteristic of the input signal 412. In one embodiment, the first characteristic of the input signal 412 is the amplitude of the input signal 412 and the second characteristic of the input signal 412 is the phase of the input signal 412.

Figures 1, 7B:
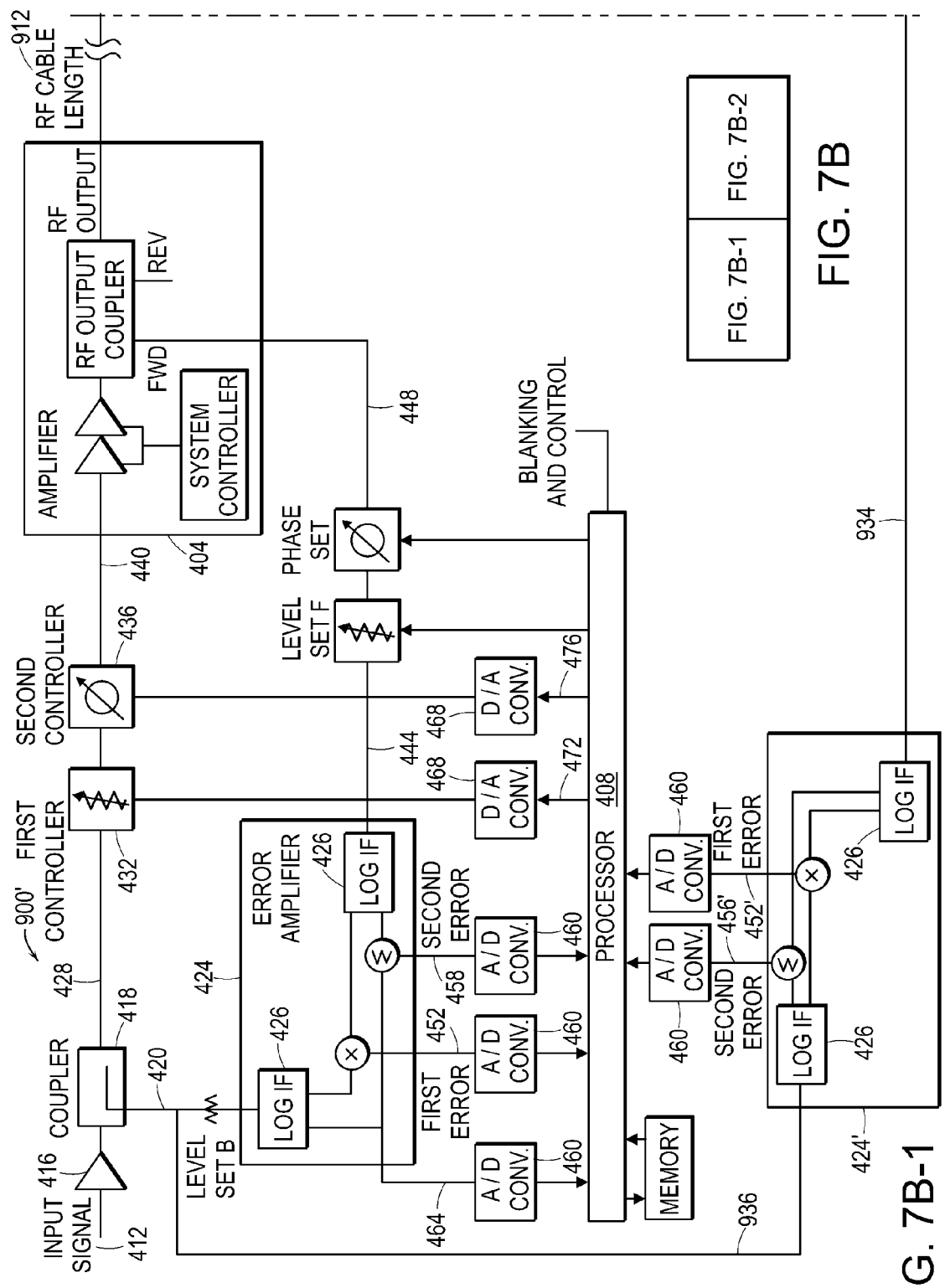
FIG. 7B is a circuit/block diagram of a closed loop, slow feedback MRI transmit stabilization module.
Figures 2, 7B:
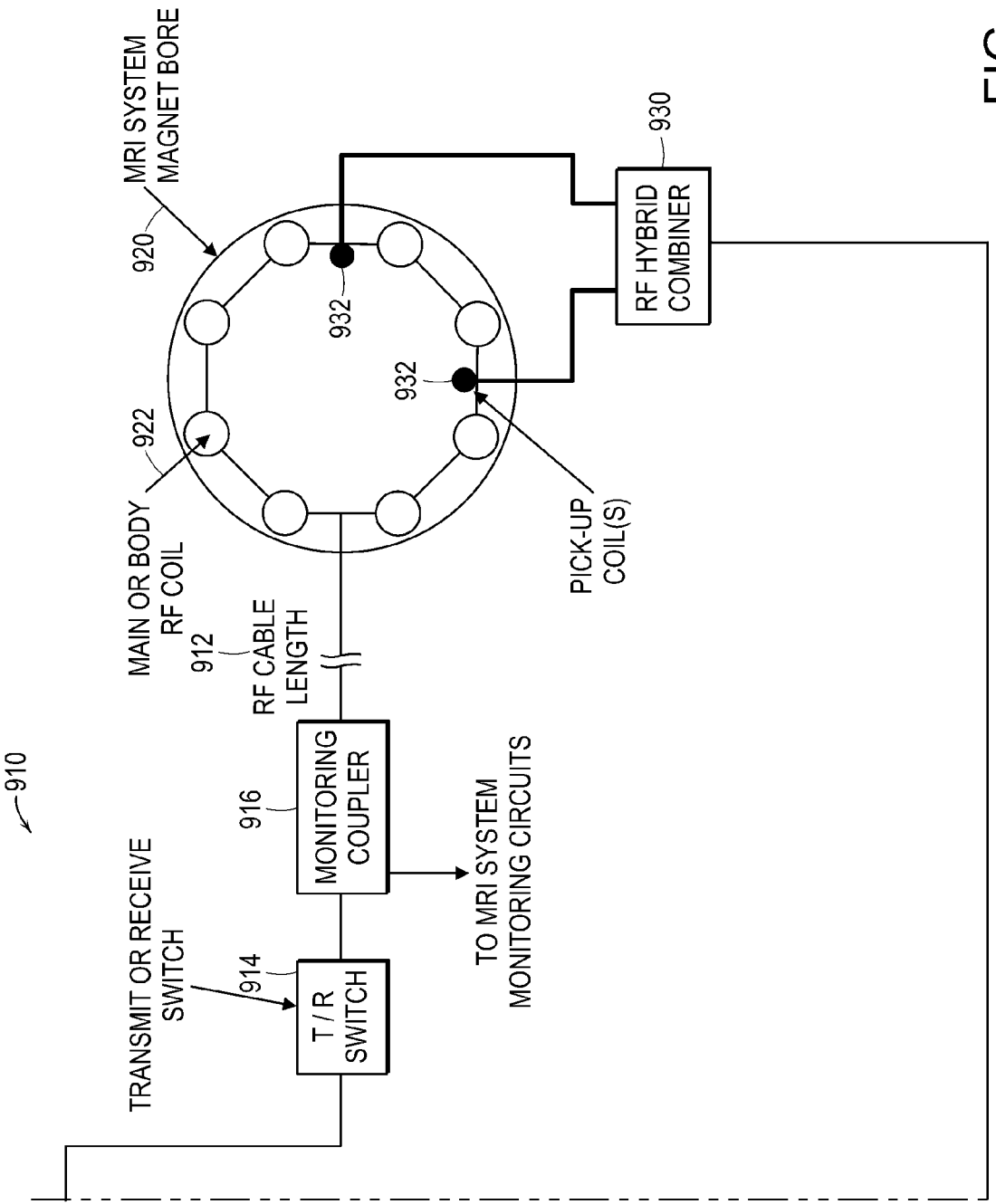

FIG. 7B depicts another embodiment of a stabilization module 900' for stabilizing an MRI power delivery system (RF transmit chain/path) 910. Generally, the stabilization module 900' adds an additional or secondary feedback loop that is summed into the error amplifier 424 (FIG. 4) for the primary loop, causing a "bias" in the primary loop that compensates for a loss/shift in the RF path of the MRI power delivery system (RF transmit chain/path) 910. The MRI power delivery system 910 includes, but is not limited too, an amplifier 404, various lengths of RF cable 912, a transmit/receive (T/R) switch 914, a monitoring coupler 916, and the MRI system magnetic bore 920. The magnetic bore 920 includes a plurality of main or body RF coils 922. In one embodiment, the stabilization module 900 includes, but is not limited too, a processor 408, a coupler 418, first and second error amplifiers 424, 424', first and second controllers 432, 436, A/D converters 460, D/A converters 468, level and phase sets, and an RF hybrid combiner 930 that senses the electromagnetic field strength in the magnetic bore 920 though a pick-up coil or antenna 932. It should be understood that there can be from one to a plurality of pick-up coils or antennas 932 located within or in close proximity to the magnetic bore 920. The placement of RF hybrid combiner 930 and associated pick-up coils 932 in the magnetic bore 920 allows the system 900' to correct in real time for gain and phase errors in all of the components in the RF transmit path 910. These errors can be caused by, but are not limited too, temperature, voltage standing wave ratio (VSWR), patient size, mechanical movement, and electrical non-linearities, all of which can change the RF path over time.

In the illustrative embodiment shown, the stabilization module 900', which is in electrical communication with the MRI power delivery system 910, includes a combination of hardware and software. The software runs on the processor 408.

Like the stabilization module 400 of FIG. 4, the stabilization module 900' receives, from an external source (e.g., a signal generator), an input signal 412 at a pre-amplifier 416. In one embodiment, the input signal 412 is a pulsed RF input signal. A directional coupler 418 then samples the pre-amplified input signal 412. A first sample 420 is input to an error amplifier 424, while a second sample 428 is input to a first controller 432 and to a second controller 436. In one embodiment, the first controller 432 is a gain controller, used to modify an amplitude of the input signal 412. In another embodiment, the second controller 436 is a phase shifter, used to modify a phase of the input signal 412. As described below, a modified input signal 440 is output by the first controller 432 and the second controller 436 and input to the amplifier 404.

In one embodiment, the amplifier 404 is used in the MRI power delivery system 910. A feedback signal 444, representative of an output signal 448 of the amplifier 404, is also input to the error amplifier 424. An input signal 420, also 936, and output signal 934 representative of the RF hybrid coupler 930, are input to the second error amplifier 424'. The output signals 452' and 456' are summed into the error amplifier 424 (FIG. 4) for the primary loop within processor 408. In one embodiment, the error amplifiers (424, 424') include logarithmic intermediate frequency (LOG IF) amplifiers 426 for amplifying the first sample 420 and the respective the feedback signals (444, 934). The error amplifier 424 generates a first error signal 452 and a second error signal 456. The first error signal 452/second error signal 456 is, in one embodiment, representative of an amplitude error between the input signal 412 and the summed feedback signal. In another embodiment, the first error signal 452/second error signal 456 is representative of a phase error between the input signal 412 and the summed feedback signal.

In one embodiment, the stabilization module 900' includes three analog to digital (A/D) converters 460. The A/D converters 460 input digitized representations of a first signal 464 representative of the input signal 412, the first error signal 452, and the second error signal 456 to the processor 408. The processor 408 performs signal processing to generate the control signals that are outputted to the digital to analog (D/A) converters 468. In one embodiment, the processor 408, as shown in FIG. 3, utilizes the second control module 308 and the calibration module 360. In one embodiment, the processor 408 executes the second control module 308 to implement a closed loop control routine. In yet another embodiment, the digital control system, including the A/D converters 460, the processor 408, and the D/A converters 468, is entirely replaced by an analog control system. Alternatively, the digital control system is only partly replaced by an analog control system.

In one embodiment, when the processor 408 implements the closed loop control routine, the second control module 308 generates the first signal 472 capable of being used to modify the first characteristic of the input signal 412 and the second signal 476 capable of being used to modify the second characteristic of the input signal 412. In one embodiment, the first characteristic of the input signal 412 is the amplitude of the input signal 412 and the second characteristic of the input signal 412 is the phase of the input signal 412.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A method for stabilizing an MRI RF power delivery system, the method comprising:
   (a) providing a stabilization module comprising a closed loop control routine for analyzing at least one feedback signal of the MRI RF power delivery system;
   (b) modifying at least one characteristic of an input signal with the closed loop control routine; and
   (c) providing the modified input signal to the MRI RF power delivery system.

2. The method of claim 1, wherein the MRI RF power delivery system includes at least includes an amplifier, a length RF cable, a transmit/receive (T/R) switch, a monitoring coupler, and an MRI system magnetic bore.

3. The method of claim 2, wherein the MRI system magnetic bore includes at least one RF coil.

4. The method of claim 2, wherein the amplifier comprises a pulsed radio frequency amplifier.

5. The method of claim 2, further comprising modifying the criterion for using the control loop routine.

6. The method of claim 5, wherein the criterion is modified based at least in part on the modified signal provided to the MRI system magnetic bore.

7. The method of claim 1, wherein a portion of the closed loop control routine is implemented by software.

8. The method of claim 1, wherein the closed loop control routine includes two feedback signals.

9. The method of claim 8, wherein one feedback signal is generated at the amplifier and one feedback signal is generated at the MRI system magnetic bore.

10. The method of claim 1, wherein the characteristics include errors at least caused by temperature, voltage standing wave ratio (VSWR), patient size, mechanical movement, and electrical non-linearities.

11. A stabilization module for stabilizing an MRI power delivery system, comprising:
a stabilization module comprising a closed loop control routine for analyzing at least one feedback signal of the MRI RF power delivery system;
wherein the stabilization module modifies at least one characteristic of an input signal with the closed loop control routine and provides the modified input signal to the MRI RF power delivery system.

12. The system of claim 11, wherein the MRI RF power delivery system includes at least an amplifier, a length RF cable, a transmit/receive (T/R) switch, a monitoring coupler, and an MRI system magnetic bore.

13. The system of claim 12, wherein the MRI system magnetic bore includes at least one RF coil.

14. The system of claim 12, wherein the amplifier comprises a pulsed radio frequency amplifier.

15. The system of claim 12, further comprising modifying the criterion for using the control loop routine.

16. The system of claim 15, wherein the criterion is modified based at least in part on the modified signal provided to the MRI system magnetic bore.

17. The system of claim 11, wherein a portion of the closed loop control routine is implemented by software.

18. The system of claim 11, wherein the closed loop control routine includes two feedback signals.

19. The system of claim 18, wherein one feedback signal is generated at the amplifier and one feedback signal is generated at the MRI system magnetic bore.

20. The system of claim 11, wherein the characteristics include errors at least caused by temperature, voltage standing wave ratio (VSWR), patient size, mechanical movement, and electrical non-linearities.

21. A computer program product, tangibly embodied in an information carrier, the computer program product including instructions being operable to cause data processing apparatus to:
receive an input signal with a stabilization module comprising a closed loop control routine for analyzing at least one feedback signal;
use the closed loop control routine to modify the characteristic of the input signal; and
provide the modified input signal to an MRI RF power delivery system.

22. A power delivery system for an MRI device, comprising:
an MRI RF power delivery system; and
a stabilization module comprising a closed loop control routine for analyzing at least one feedback signal of the MRI RF power delivery system, wherein the stabilization module modifies at least one characteristic of an input signal with the closed loop control routine and provides the modified input signal to the MRI RF power delivery system.

23. The system of claim 22, wherein the MRI RF power delivery system includes at least includes an amplifier, a length RF cable, a transmit/receive (T/R) switch, a monitoring coupler, and an MRI system magnetic bore.

24. The system of claim 22, wherein the stabilization module includes at least a processor, a coupler, at least one error amplifier, a plurality of controllers, a plurality of A/D converters, a plurality of D/A converters, a level set, a phase set, and an RF hybrid combiner.

25. The system of claim 24, wherein the RF combiner senses the electromagnetic field strength in the magnetic bore though a pick-up coil or antenna.

* * * * *